United States Patent
Manzur et al.

(10) Patent No.: US 11,163,206 B1
(45) Date of Patent: Nov. 2, 2021

(54) ACTIVE MODULATOR WITH INTEGRATED LNA DRIVER

(71) Applicant: The United States of America as represented by the Secretary of the Navy, Newport, RI (US)

(72) Inventors: Tariq Manzur, Lincoln, RI (US); Yifei Li, East Walpole, MA (US)

(73) Assignee: The United States of America as represented by the Secretary of the Navy

( * ) Notice: Subject to any disclaimer, the term of this patent is extended or adjusted under 35 U.S.C. 154(b) by 0 days.

(21) Appl. No.: 16/919,237

(22) Filed: Jul. 2, 2020

(51) Int. Cl.
- *G02F 1/225* (2006.01)
- *H03F 3/195* (2006.01)
- *H04B 10/50* (2013.01)
- *G02F 1/21* (2006.01)

(52) U.S. Cl.
CPC ............ *G02F 1/2255* (2013.01); *H03F 3/195* (2013.01); *H04B 10/5051* (2013.01); *H04B 10/5055* (2013.01); *G02F 1/212* (2021.01); *H03F 2200/294* (2013.01); *H04B 10/505* (2013.01); *H04B 2210/006* (2013.01)

(58) Field of Classification Search
CPC ... G02F 1/2255; G02F 1/212; H04B 10/5055; H04B 10/5051; H04B 2210/006; H04B 10/505; H03F 3/195; H03F 2200/294
See application file for complete search history.

(56) References Cited

U.S. PATENT DOCUMENTS

| | | | | |
|---|---|---|---|---|
| 5,920,666 A | * | 7/1999 | Digonnet | G02F 1/3517 385/16 |
| 2004/0013339 A1 | * | 1/2004 | Arakawa | G02B 6/122 385/14 |
| 2006/0024069 A1 | * | 2/2006 | Roberts | H04B 10/25137 398/198 |

FOREIGN PATENT DOCUMENTS

FR     2712096 A1 * 5/1995 ........... H04B 10/291

* cited by examiner

*Primary Examiner* — Leslie C Pascal
(74) *Attorney, Agent, or Firm* — James M. Kasischke; Michael P. Stanley

(57) ABSTRACT

An active optical modulator receives a radio frequency signal and provides an intensity modulated optical signal. The optical modulator is formed on a substrate having a doped region. An interferometer is formed on the substrate having a first path and a second path. A low noise amplifier receives the radio frequency signal and provides an electrical field to the paths. A signal laser provides an optical signal to the interferometer which is modulated and interfered to produce an intensity modulated optical signal. A pump laser provides an optical gain signal to the interferometer where it adds gain to the optical signal in the interferometer by interaction with the doped region of the substrate.

9 Claims, 4 Drawing Sheets

ACTIVE MODULATOR WITH INTEGRATED LNA DRIVER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of the Invention

The present invention is directed to an optical modulator for modulating an optical signal with a radio frequency signal and is more particularly directed to an optical modulator having active gain to ameliorate optical power losses.

(2) Description of the Prior Art

Current RF photonic links often employ an optical modulator such as a Mach-Zehnder intensity modulator formed on a material such as $LiNbO_3$. In this type of modulator, radio frequency energy is used to modulate light in the interferometer resulting in an intensity modulated optical signal. Significant optical loss is always a problem with this type of device. The modulator often has over 3 dB optical loss due to optical insertion loss. This is the loss caused by power combining, splitting, and coupling between the optical fiber and the optical modulator. Modulators also have an inherent quadrature or $V_\pi$ loss (over 3 dB). A commercial $LiNbO_3$ intensity modulator generally has an insertion loss in excess of 7 dB. This represents around 4 dB of optical insertion loss and about 3 dB of quadrature loss.

Complex communications, sensing and surveillance systems require distribution of high fidelity analog signals. Due to their wide bandwidth, low weight, and immunity against electromagnetic interference, analog fiber optic links are of great interest. However, meeting the dynamic range requirements of communication and radar systems has proven to be challenging. In particular, nonlinearities of the electro-optic modulator, photodiodes, and electronic amplifiers have prevented the true potential of analog photonic links from being realized. The dynamic range of the analog-to-digital converter (ADC) poses another bottleneck for wideband links. While significant research has been conducted on improving the components and on analog linearization, a wideband analog optical link that meets stringent performance metrics has remained elusive.

In order to covert from an electrical signal to an optical signal, a Mach-Zehnder modulator is often employed. In this type of modulator, a signal laser is provided to an electro-optic substrate (such as $LiNbO_3$ or InP). The substrate is formed with a waveguide therein. The waveguide provides two signal paths for the signal laser. A voltage is applied to the substrate that causes a variation in the lengths of the two signal paths. The two signal paths are then recombined to make an output signal. The modulator is calibrated so that at a maximum voltage, the DC half-wave voltage or $V_{\pi,RF}$, the modulator will cause the two paths to destructively interfere, resulting in a minimum output signal. At a minimum voltage, the two paths constructively interfere, resulting in a maximum output signal. As the voltage is varied, a phase modulation is placed on the optical signal provided by the signal laser. The modulator can be biased so that a zero voltage results in an intermediate level of interference, a negative minimum voltage results in minimal interference, and a positive maximum voltage results in maximum interference.

There are several techniques utilized to improve optical link performance. Amplifying the input RF signal will increase the link gain, but this will introduce additional noise and non-linearity. This should be avoided with analog photonic links. Output power can also be increased by incorporating an optical amplifier at the output of the modulator. This results in another insertion loss and additional noise.

SUMMARY OF THE INVENTION

It is a first object of the present invention to provide a modulator that adds signal power to compensate for losses.

Another object is to provide an integrated amplifier that reduces losses between the signal source and the modulator.

Accordingly, there is provided an active optical modulator that receives a radio frequency signal and provides an intensity modulated optical signal. The optical modulator is formed on a substrate having a doped region. An interferometer is formed on the substrate having a first path and a second path. A low noise amplifier receives the radio frequency signal and provides an electrical field to the first and second paths. A signal laser provides an optical signal to the interferometer paths which is modulated and interfered to produce an intensity modulated optical signal. A pump laser provides an optical gain signal to the interferometer where it adds gain to the optical signal in the interferometer by interaction with the doped region of the substrate.

BRIEF DESCRIPTION OF THE DRAWINGS

Reference is made to the accompanying drawings in which are shown an illustrative embodiment of the invention, wherein corresponding reference characters indicate corresponding parts, and wherein.

DETAILED DESCRIPTION OF THE INVENTION

Figure 1:
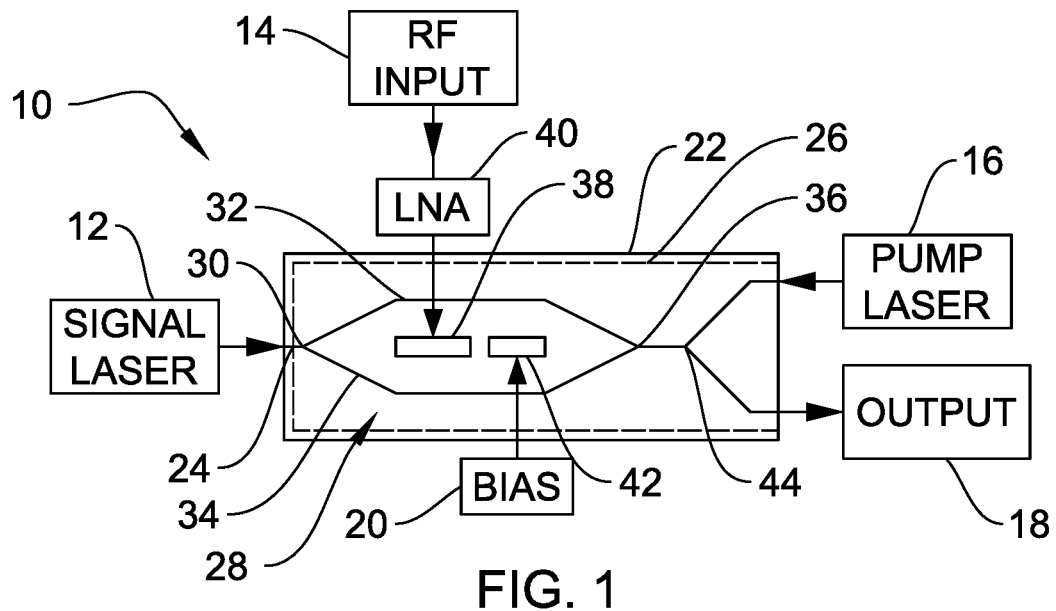
FIG. 1 is a diagram of a first embodiment.

FIG. 1 shows a first embodiment 10 of an active optical modulator. Modulator 10 receives an optical signal from signal laser 12 and modulates optical signal with input 14. Input 14 is typically a radio frequency input from about 20 kHz to 300 GHz. Pump laser 16 provides optical input to increase power in optical signal within modulator 10. Modulated optical output is provided at output 18. Modulator 10 can optionally be provided with a bias signal from bias source 20.

Modulator 10 utilizes an optical substrate 22 made from a material such as $LiNbO_3$, $LiTaO_3$, InP or the like. An optical path 24 is provided in substrate 22 as known in the art. Substrate 22 includes an active doped region 26. Active doped region 26 is doped with a rare earth material such as erbium, ytterbium, neodymium, a combination of these or the like. The doping material 26 is selected for its gain properties when used as a laser pump medium.

A Mach-Zehnder interferometer 28 is implemented in optical path 24. Interferometer 28 includes an interferometer splitter 30, a phase modulation path 32, a reference path 34, and a combiner or combining portion 36. A phase modulation electrode 38 is proximate to paths 32 and 34 to provide an electric field across these paths. The electric field causes variation in the refractive index of the substrate. A low noise amplifier (LNA) 40 is coupled to substrate 22 proximate to phase modulation path 32. Application of an electric field by LNA 40 causes changes in phase modulation path 32 that result in phase modulation of the optical signal traveling through path 32. LNA 40 is joined to receive a modulating input from input 14. Optical signal on phase modulation path 32 interferes with optical signal on reference path 34 to provide an interfered, modulated output at combining portion 36.

Another type of interferometer can be used with the embodiment described above. In the alternate type of interferometer, application of an electric field induces a positive change in one modulation path and a negative change in the other modulation path. As with the originally described modulator, the modulation paths are joined to a combining portion to provide an interfered, modulated output.

LNA 40 is preferably an integrated programmable LNA integrated circuit or chip that amplifies the RF input signal and reduces the quadrature loss. By using a programmable LNA, the LNA gain can be adjusted and tied to the best possible operating voltage range of the modulator. Depending on applications, the LNA chip can be either a commercial or custom monolithic microwave integration circuit (MMIC) on silicon or compound semiconductor. Locating both the linearizer and LNA on the modulator reduces overall device size, reduces RF loss, improves the bandwidth and limits interference.

Optionally, interferometer 28 can be provided with a bias electrode 42 that can receive an electric field that biases phase modulation path 32 with respect to reference path 34 in order to tune the amount of interference. This is done by changing the length of one path with respect to the other path. In the ordinary case, bias is set at one half of the voltage, $V_\pi$, that causes destructive interference in the interferometer. It is known to over or under bias to provide different signal characteristics. Bias electric field is provided by bias source 20.

Combining portion 36 output is joined to a directional coupler 44. An input-output of coupler 44 is joined to receive the interfered, modulated output from combining portion 36. Coupler 44 has an output that provides the interfered, modulated output to output 18. Coupler 44 has a pumping optical signal input that is optically joined to pump laser 16. Pumping optical signal is transmitted through directional coupler 44 input-output back towards combining portion 36 and into phase modulation path 32 and reference path 34. Because optical waveguide sections 32, 34, and 36 are in active doped region 26, power from pumping optical signal is transferred to substrate 22 and from there into optical signals traveling along these portions.

Active doped region 26 can be doped with appropriate rare earth ions such as, but not limited to, erbium, ytterbium, neodymium, or the like. Use of an active doped region 26 in conjunction with pump laser 16 provides optical gain that provides optical gain that counteracts the optical loss problem of intensity modulators such as the LiNbO$_3$ intensity modulator.

In a specific embodiment, signal laser 12 is a 1550 nm wavelength laser. Substrate 22 is LiNbO$_3$ and active doped region 26 is doped with erbium. Pump laser 16 is a 1480 nm wavelength laser. Optical coupler 44 is a 1480/1550 3 db direction coupler.

The erbium doping is realized by thermal in-diffusion on a commercial LiNbO$_3$ wafer. First, a 22 nm erbium was deposited on the wafer by e-beam evaporation. Then, thermal in-diffusion is performed at 1100° C. in an argon gas environment for 125 hours. The thermal diffusion depth should reach 8 microns. This diffusion process has been found to maintain surface quality with roughness<0.32 nm. This is sufficient for future processing steps of the wafer, including wafer bonding.

After erbium doping, optical waveguides can be fabricated using conventional procedures, including two main steps: Ti-diffused optical waveguide formation by titanium liftoff and thermal in-diffusion; and electrode and interconnect metal formation by liftoff. The LNA is integrated with the active modulator by thermal compression flip-chip bonding.

Figure 2:
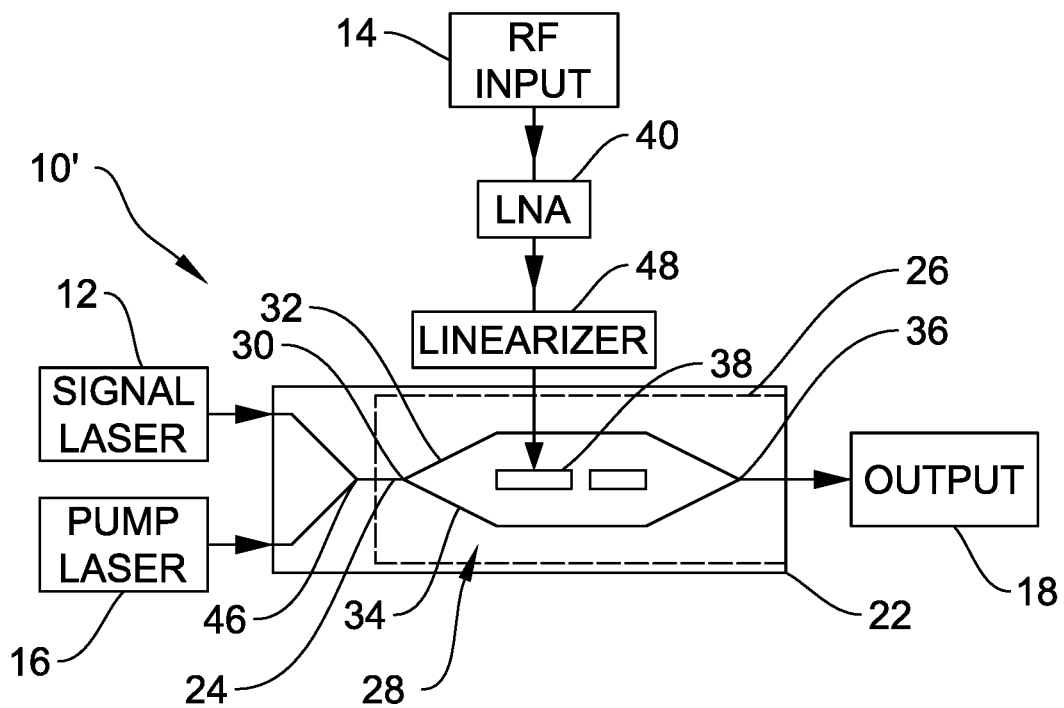
FIG. 2 is a diagram of a second embodiment.

FIG. 2 illustrates a second embodiment 10'. In this embodiment, pump laser 16 is combined with signal laser 12 in a coupler 46 in the same direction as signal laser 12. Combined signal from coupler 46 provides gain to the signal as it transits doped region 26. Pump laser 16 adds gain to modulated path 32 and reference path 34 equally. This embodiment does not require a directional coupler such as 44 shown in FIG. 1.

Another variation of the second embodiment 10' is the inclusion of an electronic linearizer 48 between LNA 40 and phase modulation electrode 38. LNA 40 receives a signal from input 14 and provides an amplified signal to linearizer 48. Linearizer 48 introduces a pre-distortion signal to the applied voltage from LNA 40. The pre-distortion signal is developed by inverting the analyzed transfer function of the modulator, as is known in the art. This overcomes the optical sinusoidal non-linearity of the Mach-Zehnder modulator when used as an intensity modulator.

Figure 3:
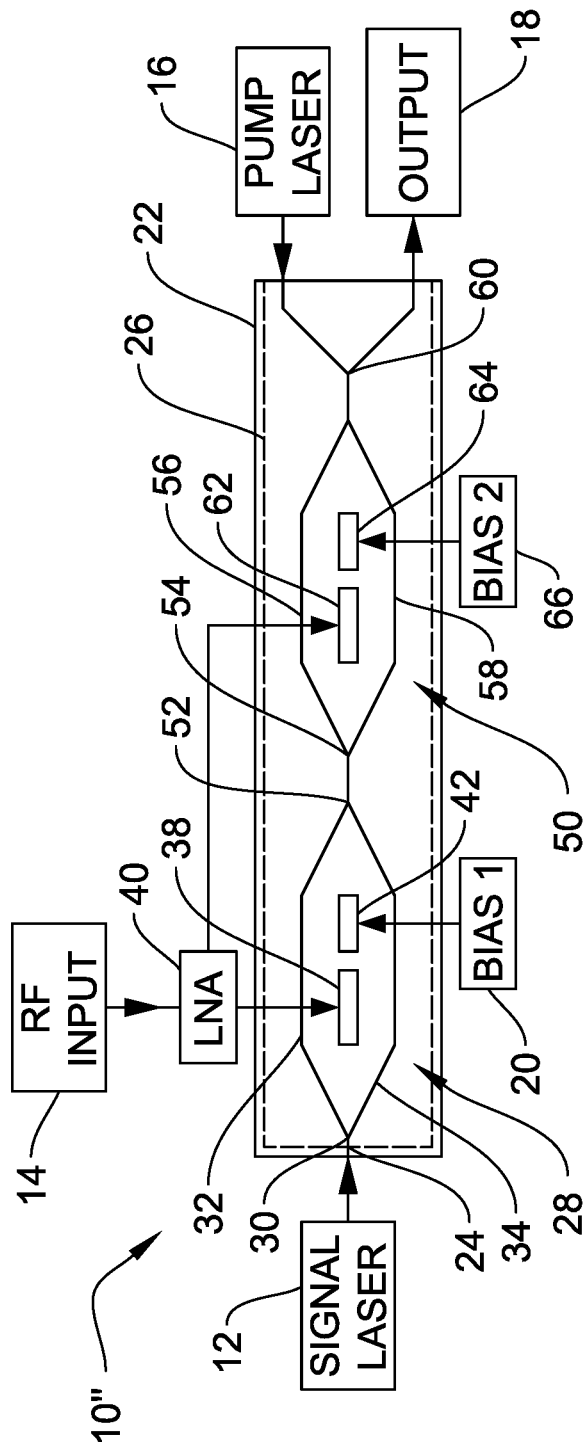
FIG. 3 is a diagram of a third embodiment.

FIG. 3 illustrates a third embodiment 10" that utilizes optical linearization. A linearizing interferometer 50 is provided and joined to receive a modulated signal from coupler 52. Modulated signal is the combined signal from both paths 32 and 34 of interferometer 28. Linearizing interferometer 50 has a splitter 54 for splitting the combined signal to a first linearizing path 56 and a second linearizing path 58. A directional coupler 60 is utilized to combine signals on first linearizing path 56 with those from second linearizing path 58 and to provide the combined signals to output 18. Directional coupler 60 also provides optical gain from pump laser 16 into linearizing interferometer 50. Optical signals in the doped region 26 will receive this gain. (Pump laser 16 could also be joined to provide optical gain to modulator 28 as shown by embodiment 10'.)

Linearizing interferometer 50 has a modulation electrode 62 and a bias electrode 64. Modulation electrode 62 is joined to LNA 40 (or other electronic circuitry) to receive an electrical voltage that can be applied as a modulation to counter non-linearities in the combined signal. Bias electrode 64 is joined to a second bias source 66. Known optical linearization schemes coordinate input from first bias source 20, second bias source 66, and the modulating signal provided to linearizing interferometer modulation electrode 62.

Figure 4:
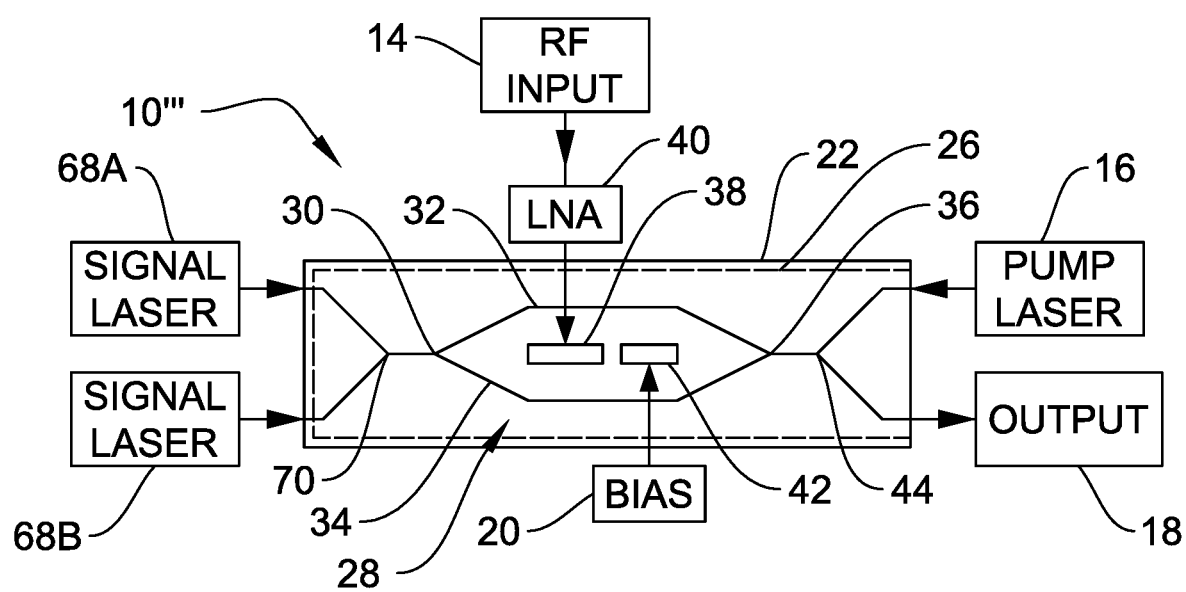
FIG. 4 is a diagram of a fourth embodiment.

In FIG. 4 there is shown a fourth embodiment 10'". In this embodiment, two signal lasers 68A and 68B are provided having different wavelengths. Optical signals from lasers 68A and 68B are combined in a coupler 70. Coupler 70 can be either formed on substrate 22 or external to substrate 22. Coupler 70 output is joined by an optical path to splitter 30 where the combined signal is split on to phase modulation path 32 or reference path 34. An electrical field provided by LNA 40 modifies the phase of the combined signal in phase modulation path 32 relative to the phase of the combined signal in reference path 34. As in FIG. 1, pump laser 16 is joined to provide a pumping optical signal to interferometer 28 through directional coupler 44. Pumping optical signal increases energy in the optical paths in doped region 26, resulting in signal gain. Thus, multiple optical signals can be modulated using this embodiment.

Figure 5:
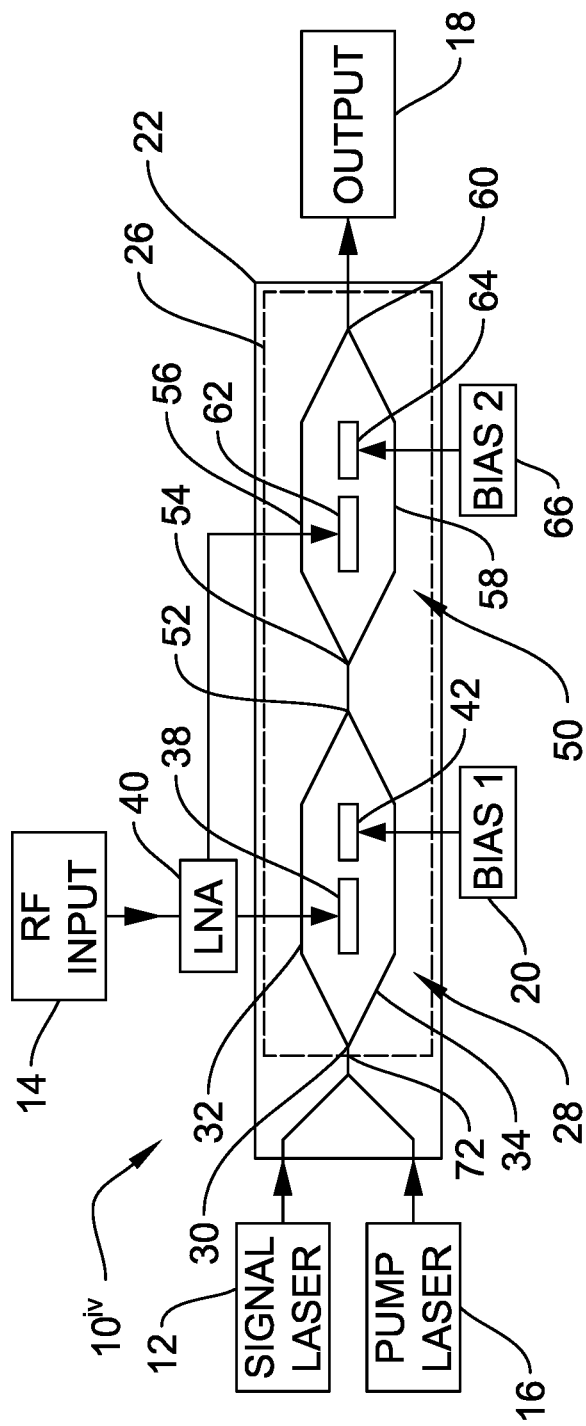
FIG. 5 is a diagram of a fifth embodiment.

In FIG. 5 there is shown a fifth embodiment $10^{iv}$. This embodiment is a variation of that shown in FIG. 3. In this embodiment, a signal laser 12 and a pump laser 16 provide optical signals that are combined in a coupler 72. Pump laser 16 provides gain in the doped region 26 of substrate 22. A linearizing interferometer 50 is provided and joined to receive a modulated signal from coupler 52. Modulated signal is the combined signal from both paths 32 and 34 of interferometer 28. Linearizing interferometer 50 has a splitter 54 for splitting the combined signal to a first linearizing path 56 and a second linearizing path 58. A directional coupler 60 is utilized to combine signals on first linearizing path 56 with those from second linearizing path 58 and to provide the combined signals to output 18. Linearizing interferometer 50 operates as described with relation to FIG. 3.

The embodiments proposed herein should improve linking between RF systems and optical systems. Under current technology, linking over a 1-20 GHz bandwidth results in noise floor (NF) of about 23 dB, and spurious free dynamic range (SFDR3) of 112 dB/Hz. Utilizing these embodiments, it is estimated that linking over a 1-20 GHz bandwidth will result in NF<5 dB; and SFDR3>120 dB/Hz.

Many different materials can be used for the modulator substrate, optical waveguide and doping. The pump laser can be on the output side of the modulator or on the input side. The modulator can have different $V_\pi$ ranges, and the range can be biased. The signal and pump lasers can be at various frequencies. Both electronic linearizers and optical linearizers can be incorporated.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive, nor to limit the invention to the precise form disclosed; and obviously, many modification and variations are possible in light of the above teaching. Such modifications and variations that may be apparent to a person skilled in the art are intended to be included within the scope of this invention as defined by the accompanying claims.

What is claimed is:

1. An active optical modulator to receive a radio frequency signal and provide an intensity modulated optical signal comprising:
    a substrate having a doped region provided thereon;
    an optical interferometer formed on said substrate in the doped region of said substrate, said interferometer having a splitter to split an optical signal into a first path and a second path, and a combiner to combine optical signals from the first path and the second path, said optical interferometer being capable of changing the phase difference between the optical signal on the first path and the optical signal on the second path upon being subjected to an electrical field;
    a signal laser joined to said optical interferometer to provide the optical signal thereto;
    a pump laser joined to said optical interferometer to provide an optical gain signal to said optical interferometer by energizing said optical interferometer in the doped region of said substrate; and
    a low noise amplifier to receive the radio frequency signal and joined to provide the electrical field to at least one of said optical interferometer first and second paths said optical interferometer joined to interfere the optical signal on the first path with the optical signal on the second path at the combiner to produce an intensity modulated optical signal with optical gain from said pump laser.

2. The apparatus of claim 1, further comprising an optical coupler having a first input joined to said signal laser, a second input joined to said pump laser, and an output joined to provide the optical signal from said signal laser and the optical gain signal from said pump laser to said optical interferometer.

3. The apparatus of claim 1, further comprising a directional coupler having a first input joined to said pump laser to receive the optical gain signal, a input-output joined to said optical interferometer combiner to provide the optical gain signal from said pump laser to said optical interferometer and to receive the intensity modulated optical signal with optical gain from said optical interferometer.

4. The apparatus of claim 3, wherein:
    said signal laser comprises at least two signal lasers with each signal laser capable of providing an optical signal at a different wavelength; and
    further comprising a multiport optical coupler joined to said at least two signal lasers to receive the optical signal from each of said at least two signal lasers and to combine the optical signals at different wavelengths, said multiport optical coupler having a multiport optical coupler output joined to said optical interferometer to provide the combined optical signals as the optical signal.

5. The apparatus of claim 1, further comprising a bias source to provide a bias signal to said optical interferometer, said optical interferometer having a bias region formed therein to receive the bias signal and change the length of the first path relative to the second path.

6. The apparatus of claim 1, further comprising an electronic linearizer having a linearizer input joined to said low noise amplifier output and a linearized output to modify the electrical field therefrom and to provide a linearized electrical field to said optical interferometer as the electrical field.

7. The apparatus of claim 1, further comprising a linearizing interferometer formed on said substrate in the doped region of said substrate and joined to said optical interferometer combiner to receive the intensity modulated optical signal and to said low noise amplifier, said linearizing interferometer having a splitter to split the intensity modulated optical signal into a first optical path and a second optical path, and a combiner to combine signals on the first optical path and the second optical path, said linearizing interferometer being capable of changing the phase of the intensity modulated optical signal in response to a linearizing signal received from said low noise amplifier, said linearizing interferometer providing a linearized, modulated optical signal at said linearizing interferometer combiner output.

8. The apparatus of claim 7, further comprising an optical coupler having a first input joined to said signal laser, a second input joined to said pump laser, and an output joined to provide the optical signal from said signal laser and the optical gain signal from said pump laser to said optical interferometer.

9. The apparatus of claim 7, further comprising a directional coupler having a first input joined to said pump laser to receive the optical gain signal, a input-output joined to said linearizing interferometer combiner to provide the optical gain signal from said pump laser to said linearizing interferometer and to receive the linearized intensity modulated optical signal with optical gain from said linearizing interferometer.

* * * * *